United States Patent
Fujimaru et al.

(10) Patent No.: US 7,618,203 B2
(45) Date of Patent: Nov. 17, 2009

(54) SUBSTRATE PROCESSING METHOD, SUBSTRATE PROCESSING APPARATUS, AND COMPUTER READABLE STORAGE MEDIUM

(75) Inventors: Syuzo Fujimaru, Koshi (JP); Kensei Yamamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 48 days.

(21) Appl. No.: 12/051,995

(22) Filed: Mar. 20, 2008

(65) Prior Publication Data
US 2008/0241715 A1 Oct. 2, 2008

(30) Foreign Application Priority Data
Mar. 27, 2007 (JP) ............ 2007-081316

(51) Int. Cl.
- G03D 5/00 (2006.01)
- G06F 19/00 (2006.01)
- B05C 11/00 (2006.01)

(52) U.S. Cl. .................. 396/611; 700/121; 118/663

(58) Field of Classification Search .......... 396/611; 700/100, 121; 118/663; 438/5; 414/935
See application file for complete search history.

(56) References Cited

U.S. PATENT DOCUMENTS

| | | | |
|---|---|---|---|
| 6,945,258 B2* | 9/2005 | Itou | 134/56 R |
| 7,364,922 B2* | 4/2008 | Shimizu | 438/5 |
| 2006/0162660 A1* | 7/2006 | Shimizu | 118/719 |
| 2009/0016860 A1* | 1/2009 | Kaneko et al. | 414/222.11 |

FOREIGN PATENT DOCUMENTS

| | | |
|---|---|---|
| JP | 3328869 | 7/2002 |
| JP | 2006-203003 | 8/2006 |
| JP | 2006-203145 | 8/2006 |

OTHER PUBLICATIONS

English Translation of JP 09-017838 (dated Jan. 17, 1997).*

* cited by examiner

*Primary Examiner*—Alan A Mathews
(74) *Attorney, Agent, or Firm*—Oblon, Spivak, McClelland, Maier & Neustadt, L.L.P.

(57) ABSTRACT

In the present invention, when trouble occurs and the operation of a substrate processing apparatus is stopped, substrate information containing positions and processing states of the substrates located in the apparatus at that time is stored, and the power supply of the apparatus is then turned off. When the apparatus is restarted, the substrates located in the apparatus are collected into a substrate housing unit, and each of the substrates in the substrate housing unit is then sequentially transferred to a plurality of processing units following the same transfer recipe as that before occurrence of trouble, and substrate processing is not performed in a processing unit in which processing has already been completed, whereas substrate processing is performed in a processing unit in which processing has not been performed yet, based on the substrate information.

15 Claims, 14 Drawing Sheets

FIG.12

| TRANSFER SELECTION | WAFER No | WAFER POSITION | WAFER PROCESSING STATE |
|---|---|---|---|
| OFF | W1 | CASSETTE | ....... |
| OFF | W2 | POST-BAKING UNIT | UNDER PROCESSING |
| ....... | ....... | ........ | ....... |
| ON | W25 | CASSETTE | ....... |

130a

SUBSTRATE PROCESSING METHOD, SUBSTRATE PROCESSING APPARATUS, AND COMPUTER READABLE STORAGE MEDIUM

BACKGROUND OF THE INVENTION

1. Field of the Invention

The present invention relates to a substrate processing method, a substrate processing apparatus, and a computer-readable storage medium.

2. Description of the Related Art

The photolithography process in manufacturing a semiconductor device is usually performed using a coating and developing treatment apparatus. The coating and developing treatment apparatus includes, for example, a cassette station for transferring-in/out a substrate; a processing station in which a plurality of processing and treatment units are arranged for performing various kinds of processing and treatment such as resist coating treatment, developing treatment and thermal processing and so on; and an interface station for passing the substrate between an adjacent exposure processing unit and the processing station. The coating and developing treatment apparatus includes a plurality of substrate transfer units for transferring the substrate between the stations and between the processing units.

In the above-described coating and developing treatment apparatus, a plurality of substrates are processed in a manner of single substrate processing following a predetermined processing recipe. For example, the plurality of substrates housed in a cassette in the cassette station are successively transferred to the processing station, and each of the substrate is subjected to the resist coating treatment, the thermal processing and so on in the processing and treatment unit in the processing station in a predetermined order. The substrates are then successively transferred to the exposure processing unit via the interface station and subjected to exposure processing, and then returned again into the processing station and subjected to predetermined processing and treatment such as developing treatment and so on in the processing units. The substrates are then successively returned from the processing station back into the cassette station and housed in the original cassette.

If trouble such as failure occurs in an operating processing unit in the above-described coating and developing treatment apparatus, it is necessary to stop the operation of the coating and developing treatment apparatus and turn off the power supply and repair the failed processing unit. In this event, many substrates are usually left in the coating and developing treatment apparatus. These substrates have been collected into the cassette station by collecting operation by an operator in order to return the coating and developing treatment apparatus into a normal state and restart usual substrate processing. In order to prevent waste of the collected substrates, it is proposed that, for example, each of the collected substrates is transferred to the processing units in which the substrate has not been subjected to steps, and subjected to the remaining processing (Japanese Patent Application Laid-open No. H9-17838).

SUMMARY OF THE INVENTION

Usually, the transfer of the substrates in the coating and developing treatment apparatus is performed following a transfer recipe which defines a transfer route of the substrates following a processing recipe. This transfer recipe is usually set in a control unit of the coating and developing treatment apparatus.

In order to process the substrate collected after occurrence of trouble in the coating and developing treatment apparatus from the midpoint in the processing recipe as described above, the substrate needs to be sequentially transferred to the processing and treatment units in which remaining processing and treatment are performed. To this end, a new transfer recipe for the collected substrate is required. However, since the substrates collected in the coating and developing treatment apparatus are different in processed stage from substrate to substrate, for example, it is necessary to create a transfer recipe for each of the substrates and execute each transfer recipe for each substrate. Therefore it takes time to create the transfer recipes and the control for execution of the transfer recipes also becomes complicated. As a result, it has been actually difficult to start again the processing recipe from the midpoint for the once collected substrate.

The present invention has been developed in consideration of the above points, and its object is to perform, in a substrate processing apparatus such as a coating and developing treatment apparatus, the remaining processing of a substrate which was located in the substrate processing apparatus when trouble occurred, at an early stage and by simple control.

The present invention to achieve the above object is a substrate processing method of performing substrate processing in a predetermined processing recipe in a substrate processing apparatus including a substrate housing unit housing a plurality of substrates and a plurality of processing units performing various kinds of processing on the substrates, by sequentially transferring the plurality of substrates in the substrate housing unit to a predetermined plurality of processing units following a transfer recipe. The processing method of the present invention includes the steps of: storing, when trouble occurs and an operation of the substrate processing apparatus is stopped, substrate information containing positions and processing states of the substrates located in the substrate processing apparatus at that time; collecting, when a power supply of the substrate processing apparatus is then turned off and thereafter the substrate processing apparatus is restarted, the substrates located in the substrate processing apparatus into the substrate housing unit; and thereafter sequentially transferring each of the substrates in the substrate housing unit to the predetermined plurality of processing units following a same transfer recipe as that before occurrence of trouble, and not performing processing on the substrate in a processing unit in which processing for the substrate has already been completed but performing processing on the substrate in a processing unit in which processing for the substrate has not been performed yet based on the substrate information to thereby perform remaining substrate processing of the predetermined processing recipe.

Note that the "trouble" includes not only a case in which various components in the substrate processing apparatus have failed but also a case in which substrate processing performed in the substrate processing apparatus is not appropriately performed.

According to the present invention, the substrate information such as positions and processing states of substrates are stored when trouble occurs, and after the substrates which were located in the substrate processing apparatus when trouble occurred are collected into the substrate housing unit, the substrates are transferred in the same recipe based on the substrate information. Then, processing is not performed on the substrate in a processing unit in which processing for the substrate had already been completed when trouble occurred, whereas processing is performed on the substrate in a processing unit in which processing for the substrate has not been performed yet to thereby perform remaining processing of the predetermined processing recipe. This allows the same transfer recipe to be used when the remaining processing is performed on the substrate which was located in the substrate processing apparatus when trouble occurred, thereby reducing the time to create the transfer recipe for each of the substrates and simplifying the control for execution of the transfer recipe for each of the substrates. Accordingly, the remaining processing of the substrates which were located in the substrate processing apparatus when trouble occurred can be performed at an early stage and by simple control.

The present invention according to another aspect is a substrate processing apparatus including a substrate housing unit housing a plurality of substrates and a plurality of processing units performing various kinds of processing on the substrates, for performing substrate processing in a predetermined processing recipe by sequentially transferring the plurality of substrates in the substrate housing unit to a predetermined plurality of processing units following a transfer recipe, the apparatus including: a control unit conducting control to store, when trouble occurs and an operation of the substrate processing apparatus is stopped, substrate information containing positions and processing states of the substrates located in the substrate processing apparatus at that time; collect, when the substrate processing apparatus is restarted, the substrates which are located in the substrate processing apparatus into the substrate housing unit; and sequentially transfer each of the substrates in the substrate housing unit to the predetermined plurality of processing units following a same transfer recipe as that before occurrence of trouble, and not perform processing on the substrate in a processing unit in which processing for the substrate has already been completed but perform processing on the substrate in a processing unit in which processing for the substrate has not been performed yet based on the substrate information to thereby perform remaining substrate processing of the predetermined processing recipe.

The present invention according to another aspect is a computer-readable storage medium storing a program running on a computer of a control unit controlling a substrate processing apparatus to cause the substrate processing apparatus to execute the above-described substrate processing method.

According to the present invention, the remaining processing of substrates which were located in a substrate processing apparatus when trouble occurred can be appropriately performed, thereby reducing waste substrates to improve the productivity of substrates.

BRIEF DESCRIPTION OF THE DRAWINGS

FIG. 12 is an explanatory view showing an example of a display screen;

DETAILED DESCRIPTION OF THE INVENTION

Figure 1:
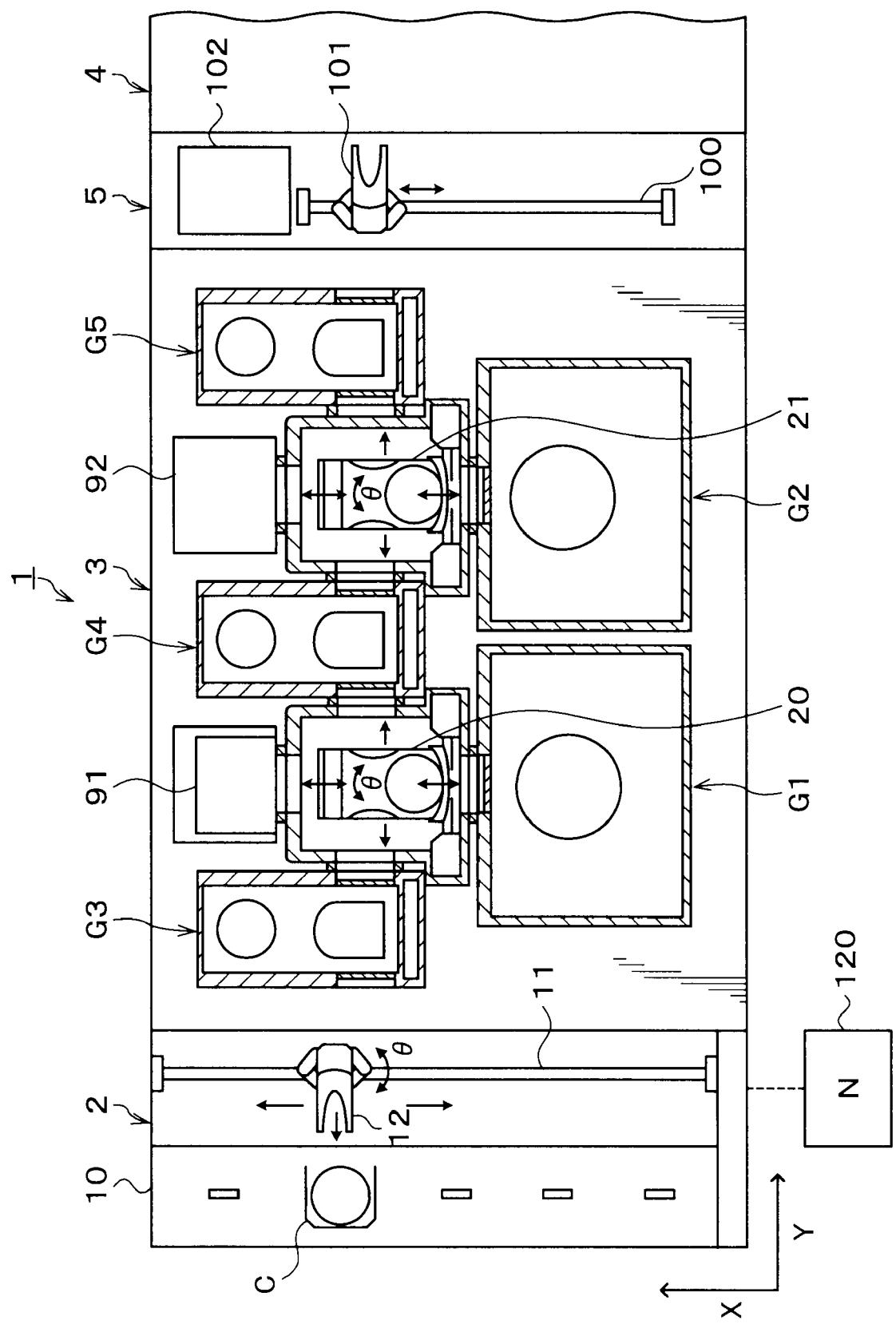
FIG. 1 is a plan view showing the outline of a configuration of a coating and developing treatment apparatus.
Figure 2:
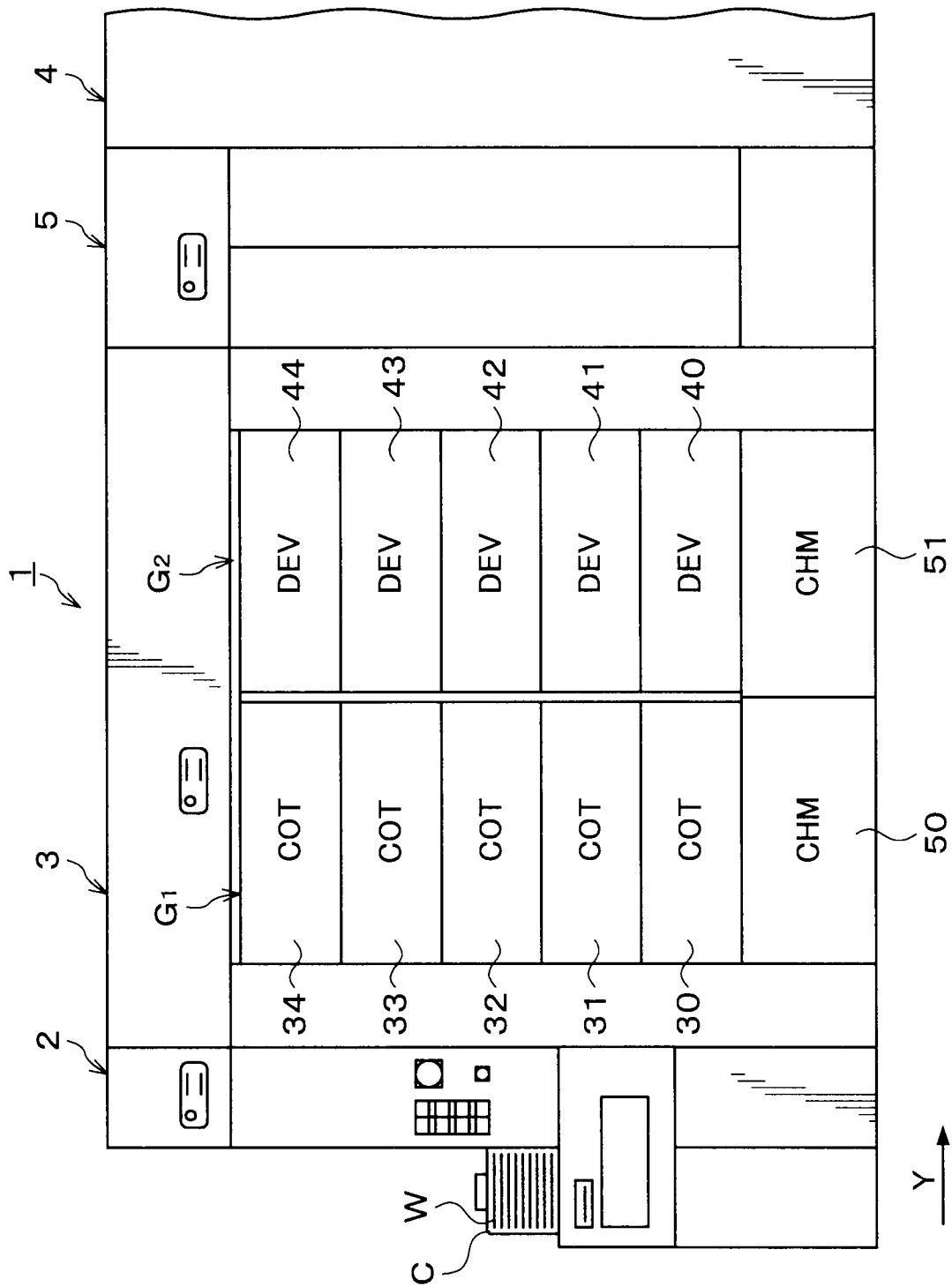
FIG. 2 is a front view of the coating and developing treatment apparatus in FIG. 1.
Figure 3:
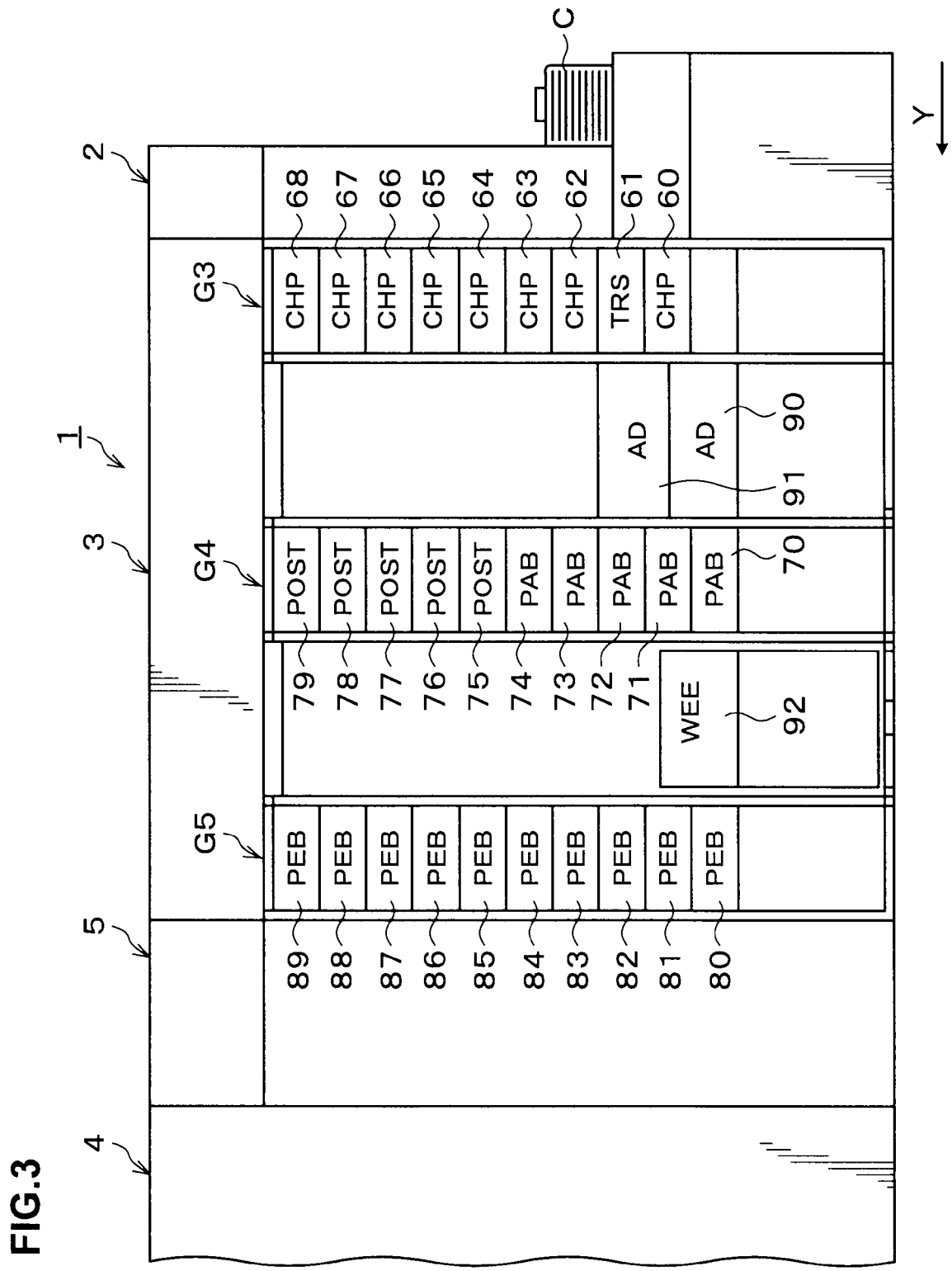
FIG. 3 is a rear view of the coating and developing treatment apparatus in FIG. 1.

Hereinafter, a preferred embodiment of the present invention will be described. FIG. 1 is a plan view showing the outline of a configuration of a coating and developing treatment apparatus 1 as a substrate processing apparatus in which a substrate processing method according to the present invention is realized, FIG. 2 is a front view of the coating and developing treatment apparatus 1, and FIG. 3 is a rear view of the coating and developing treatment apparatus 1.

The coating and developing treatment apparatus 1 has, as shown in FIG. 1, a configuration in which, for example, a cassette station 2 for transferring a plurality of wafers W per cassette as a unit from/to the outside into/from the coating and developing treatment apparatus 1; a processing station 3 including a plurality of various kinds of processing and treatment units each for performing predetermined processing or treatment in a manner of single wafer processing in the photolithography process; and an interface station 5 for delivering the wafers W to/from an exposure processing unit 4 provided adjacent to the processing station 3, are integrally connected together.

In the cassette station 2, a cassette mounting table 10 is provided on which a plurality of cassettes C as substrate housing units can be mounted in a line in an X-direction (a top-to-bottom direction in FIG. 1). In the cassette C, a plurality of slots are formed which are vertically arranged, so that a plurality of wafers W can be housed by insertion of the wafer into each of the slots. In the cassette station 2, a wafer transfer unit 12 is provided which is movable on a transfer path 11 along the X-direction. The wafer transfer unit 12 is also movable in an arrangement direction of the wafers W housed in the cassette C (a Z-direction; the vertical direction), and thus can selectively access the plurality of wafers W in the cassette C. The wafer transfer unit 12 is rotatable around an axis in the vertical direction (in a θ-direction), and can access processing and treatment units included in a later-described third processing unit group G3 in the processing station 3 and transfer the wafer W to them.

The processing station 3 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side toward the interface station 5 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side toward the interface station 5 side. Between the third processing unit group G3 and the fourth processing unit group G4, a first transfer unit 20 is provided. The first transfer unit 20 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 21 is provided. The second transfer unit 21 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 30 to 34 each for applying a resist solution to the wafer W are, for example, five-tiered in order from the bottom. In the second processing unit group G2, solution treatment units, for example, developing treatment units 40 to 44 each for supplying a developing solution to the wafer W to perform developing treatment on it are five-tiered in order from the bottom. Further, chemical chambers 50 and 51 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, a thermal processing unit 60 for performing heating and cooling the wafer W, a transition unit 61 for passing the wafer W, thermal processing units 62 to 68 each for performing heating and cooling the wafer W are nine-tiered in order from the bottom.

In the fourth processing unit group G4, a plurality of thermal processing units each for thermally processing the wafer W, for example, pre-baking units 70 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for thermally processing the wafer W, for example, post-exposure baking units 80 to 89 each for heat-processing the wafer W after exposure are ten-tiered in order from the bottom. Note that the above-described pre-baking units 70 to 74, the post-baking units 75 to 79, and the post-exposure baking units 80 to 89 each have a heating plate and a cooling plate for mounting the wafer W thereon and can both heat and cool it.

As shown in FIG. 1, on the positive direction side in the X-direction to the first transfer unit 20, a plurality of treatment units are arranged, for example, adhesion units 90 and 91 each for performing hydrophobic treatment on the wafer W being two-tiered in order from the bottom as shown in FIG. 3. As shown in FIG. 1, on the positive direction side in the X-direction to the second transfer unit 21, for example, an edge exposure processing unit 92 is disposed which selectively exposes only the edge portion of the wafer W to light.

In the interface station 5, for example, a wafer transfer unit 101 moving on a transfer path 100 extending in the X-direction and a buffer cassette 102 are provided as shown in FIG. 1. The wafer transfer unit 101 is movable in the Z-direction and also rotatable in the θ-direction, and thus can access the exposure processing unit 4 adjacent to the interface station 5, the buffer cassette 102, and each of the processing units in the fifth processing unit group G5 and transfer the wafer W to them.

Operations of the coating and developing treatment apparatus 1 and the above-described processing and treatment units and operations of the transfer units are controlled, for example, by a control unit 120 shown in FIG. 1. The control unit 120 is composed of, for example, a computer comprising a CPU and a memory, and can realize the wafer processing method according to this embodiment in the coating and developing treatment apparatus 1, for example, by executing programs stored in the memory. Various kinds of programs in use for realizing the wafer processing method are those stored in a recording medium N such as a computer-readable CD or the like, and installed on the control unit 120 from the recording medium N.

For example, the wafer processing and the wafer transfer in the coating and developing treatment apparatus 1 are controlled by the control unit 120. In the control unit 120, a processing recipe for the wafer W is set for each lot. In the control unit 120, a transfer recipe for the wafer W, for example, corresponding to the processing recipe is further set so that the W is transferred following the transfer recipe for performance of the wafer processing.

Figure 4:
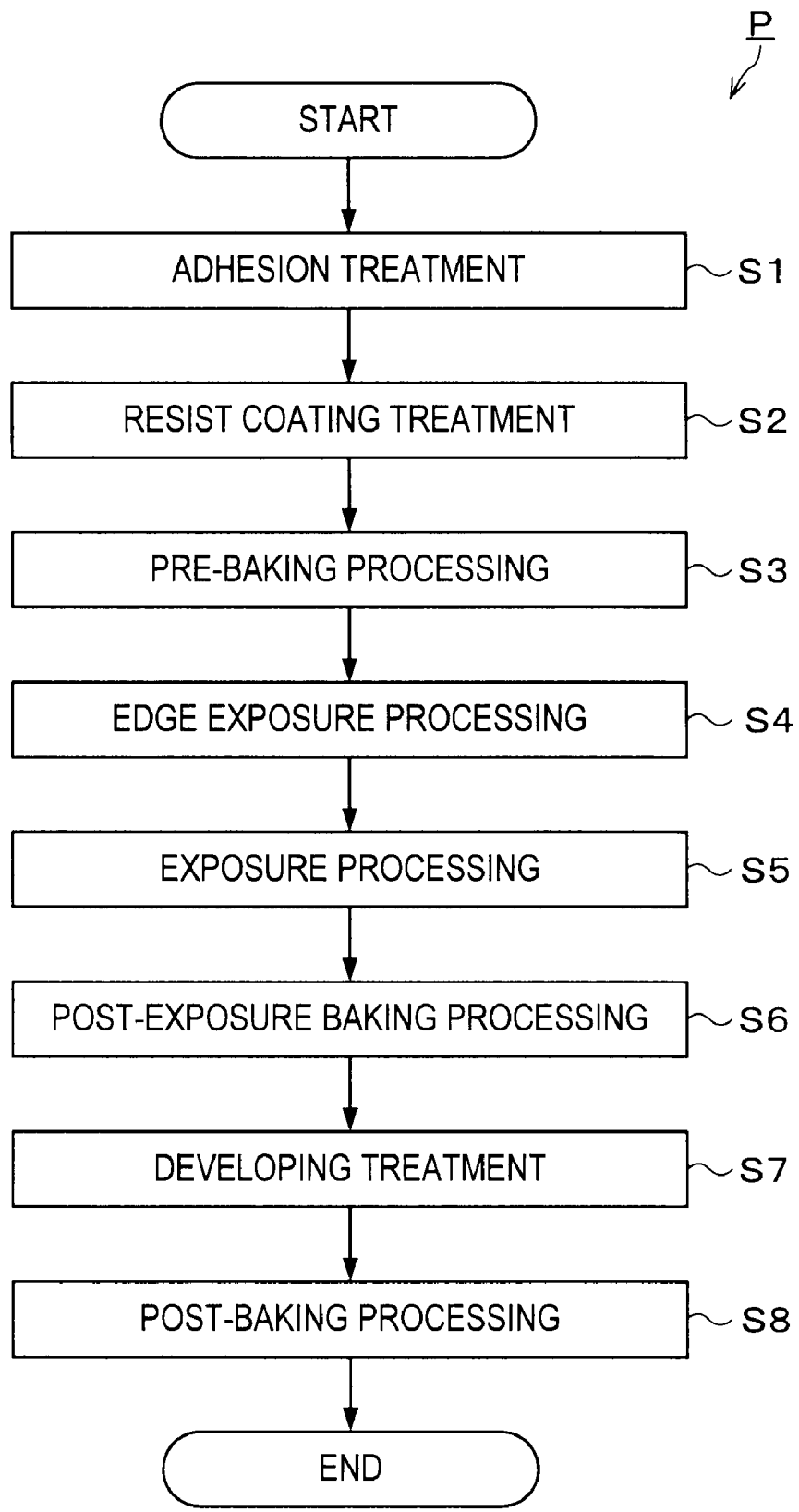
FIG. 4 is an explanatory view showing an example of a processing recipe.

In this embodiment, a processing recipe P for processing the wafer W in the order of adhesion treatment S1, resist coating treatment S2, pre-baking processing S3, edge exposure processing S4, exposure processing S5, post-exposure baking processing S6, developing treatment S7, and post-baking processing S8 is set, for example, in the control unit 120 as shown in FIG. 4.

Figure 5:
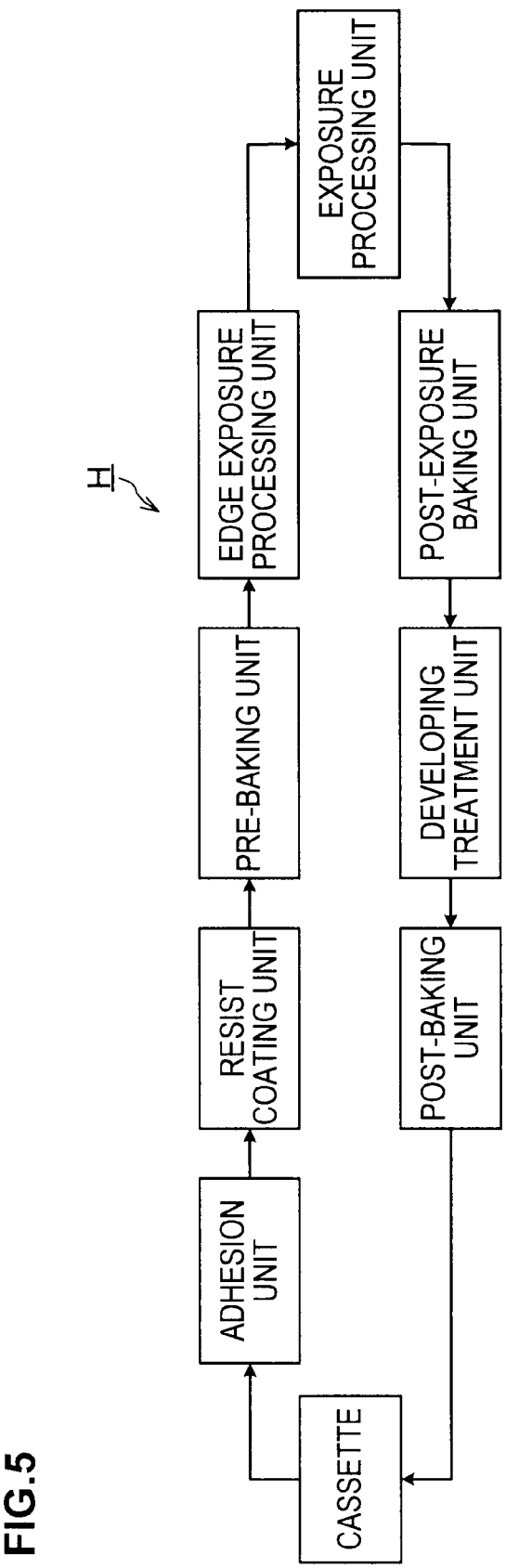
FIG. 5 is an explanatory view showing an example of a transfer recipe.

In the control unit 120, a transfer recipe H is set for transferring the wafer W, for example, from the cassette to the adhesion unit, the resist coating unit, the pre-baking unit, the edge exposure processing unit, the exposure processing unit, the post-exposure baking unit, the developing treatment unit, the post-baking unit, and the cassette in this order as shown in FIG. 5 following the processing recipe P.

Next, the wafer processing method according to this embodiment performed in the coating and developing treatment apparatus 1 configured as described above will be described.

In the coating and developing treatment apparatus 1, when a cassette C housing, for example, 25 wafers W in a lot unit is set in the cassette station 2, the 25 wafers W in the cassette C are successively transferred to the processing and treatment units in the processing station 3 and the exposure processing unit 4 following the transfer recipe H shown in FIG. 5, and each of the wafer W is subjected to the wafer processing of the processing recipe P shown in FIG. 4. The 25 wafers W are continuously transferred, so that a plurality of wafers W are processed at the same time in the coating and developing treatment apparatus 1.

Figure 6:
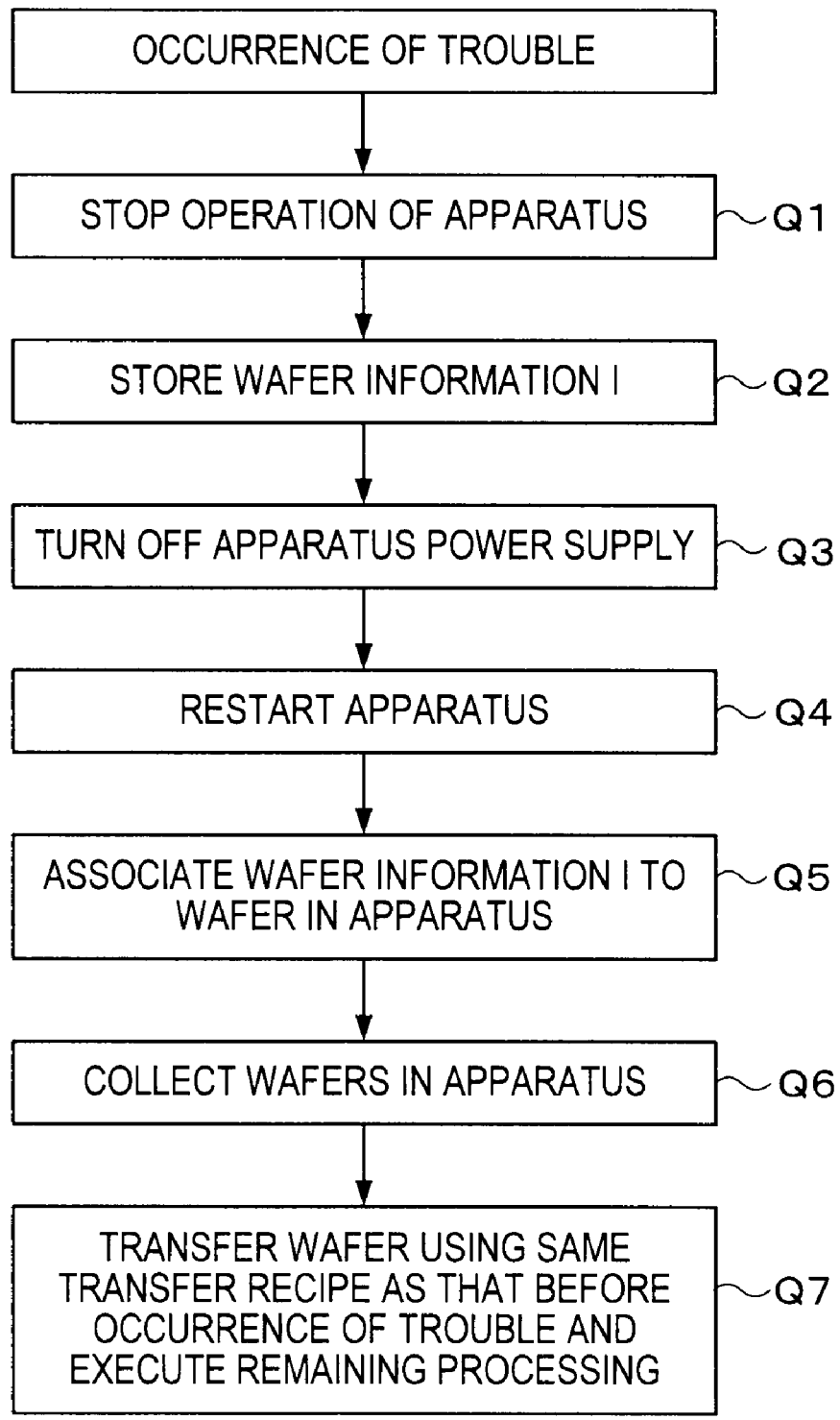
FIG. 6 is a flowchart of a wafer processing method according to the embodiment.

FIG. 6 shows a wafer processing flow when trouble occurs in the coating and developing treatment apparatus 1. When trouble occurs in the coating and developing treatment apparatus 1, alarm is immediately issued and the operation of the coating and developing treatment apparatus 1 is stopped (Step Q1 in FIG. 6). In this event, wafer information I indicating the positions and the processing states of each of the wafers W located in the coating and developing treatment apparatus 1 is grasped, for example, by the control unit 120, and the wafer information I is stored, for example, in the storage unit of the control unit 120 (Step Q2 in FIG. 6).

As the positional information on each of the wafers W of the wafer information I, the position where each of the wafers W is located on the transfer recipe H, that is, the processing unit in which the wafer W is placed or the processing units between which the wafer W is being transferred is grasped and stored. As the processing state information on each of the wafers W of the wafer information I, whether the wafer W is before start of processing or under processing, or after completion of processing in the processing unit in which the wafer W is placed, is grasped and stored.

Figure 7:
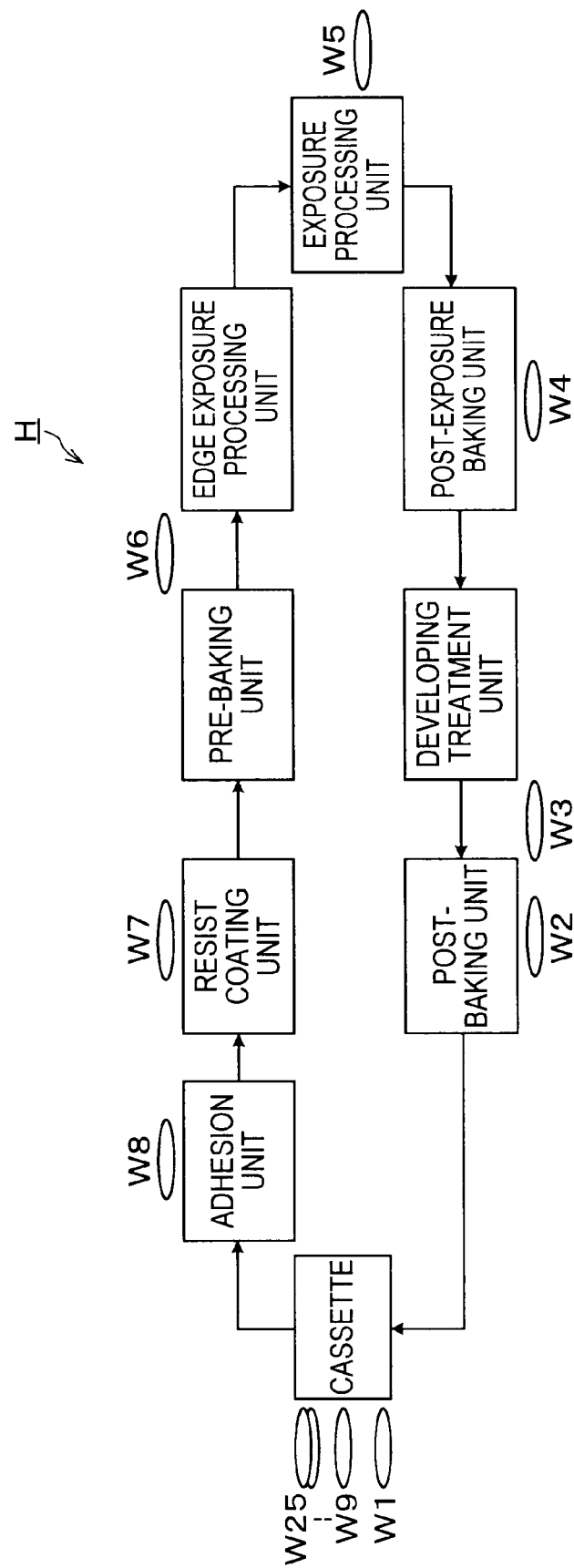
FIG. 7 is an explanatory view showing positions of wafers when trouble occurs.

For example, in the case shown in FIG. 7, a wafer W1 for which the processing recipe P has been completed and is located in the cassette C, and a wafer W2 is located in the post-baking unit and is under post-baking processing. Further, a wafer W3 is located between the developing treatment unit and the post-baking unit, and a wafer W4 is located in the post-exposure baking unit. The wafer W4 is, for example, in a state before start of the post-exposure baking processing. A wafer W5 is located in the exposure processing unit and is under exposure processing. A wafer W6 is located between the pre-baking unit and the edge exposure processing unit, and a wafer W7 is located in the resist coating unit and is under resist coating treatment. A wafer W8 is located, for example, in the adhesion unit, and adhesion treatment for it has been completed. A wafer W9 and subsequent wafers W (a wafer W9 to a wafer W25) are located, in unprocessed state, in the cassette C. The wafer information I on the wafers W1 to W25 is stored in the control unit 120.

Next, the power supply of the coating and developing treatment apparatus 1 is turned off (shut down) (Step Q3 in FIG. 6), and the trouble is solved, for example, by an operator or the like. Thereafter, the power supply of the coating and developing treatment apparatus 1 is turned on, whereby the apparatus is restarted (Step Q4 in FIG. 6). Thereafter, the wafers W located in the coating and developing treatment apparatus 1 are associated with the wafer information I stored in the above-described control unit 120 (Step Q5 in FIG. 6). This allows the control unit 120 to recognize again the position and the processing state of each of the wafers W located in the coating and developing treatment apparatus 1.

Next, all of the wafers W located in the coating and developing treatment apparatus 1 are returned and collected into the cassette C in the cassette station 2, for example, using the transfer units 12, 20, 21 and 101 (Step Q6 in FIG. 6). In this event, the wafers W are collected into the same cassette C as that in which the wafers W have been housed when unprocessed.

Next, predetermined wafers out of the 25 wafers W in the cassette C are successively transferred to the processing and treatment units in the processing station 3 and the exposure processing unit 4 in a predetermined order following the same transfer recipe H as that shown in FIG. 5, and each of the wafers W is subjected to remaining processing (Step Q7 in FIG. 6). Setting in this event is made such that based on the wafer information I, the wafers W which were located in any of the processing and treatment units and under processing and treatment in those processing and treatment units when trouble occurred, and the wafers W for which the processing recipe P had already been completed when trouble occurred, are not transferred out of the cassette C. In the example shown in FIG. 7, setting is made such that, for example, the wafer W1 for which the processing recipe P has already been completed and the wafer W2, wafer W5 and wafer W7 which have been under processing and treatment in the processing and treatment units are not transferred, so that the other wafer W3, wafer W4, wafer W6, wafer W8 and wafer W9 to wafer W25 are transferred.

Each of the wafer W transferred out of the cassette C is transferred to the processing and treatment units in the processing station 3 and the exposure processing unit 4 in a predetermined order following the transfer recipe H, and the wafer W is not subjected to processing when it is transferred to the processing or treatment unit in which it has already been subjected to the processing or treatment, but the wafer W is subjected to processing or treatment when it is transferred to a processing or treatment unit in which it has not been subjected to the processing or treatment yet. In other words, the wafer W is transferred following the transfer recipe H also into the processing or treatment unit in which it has already been subjected to the processing or treatment and transferred out of the unit without being subjected to processing or treatment.

Figure 8:
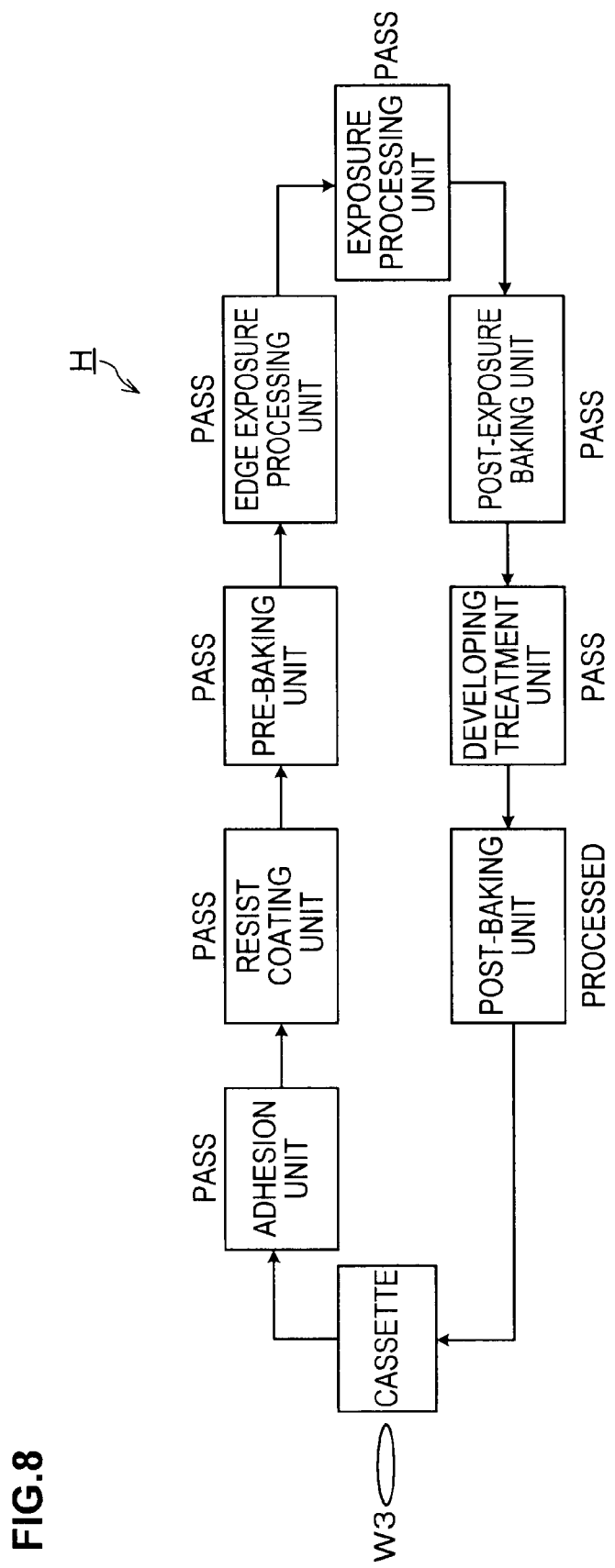
FIG. 8 is an explanatory view showing the presence or absence of processing and treatment in the processing and treatment units of a wafer which is transferred again.
Figure 9:
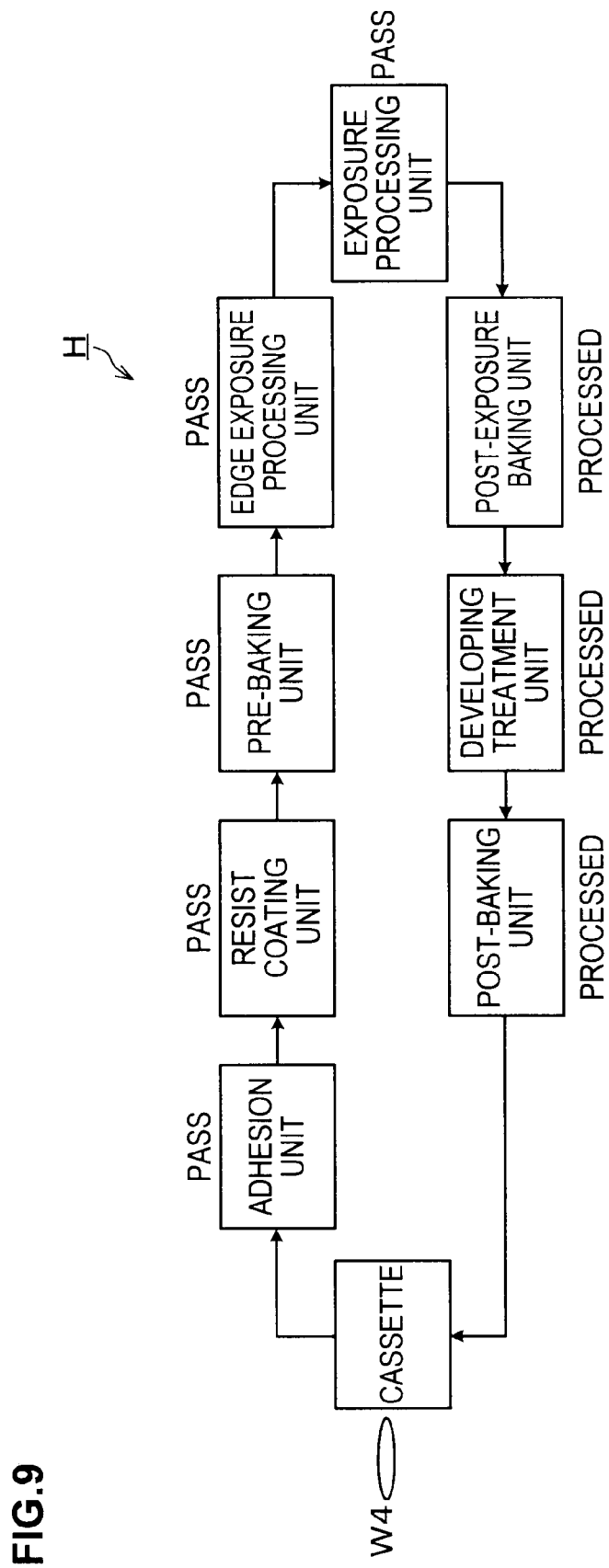
FIG. 9 is an explanatory view showing the presence or absence of processing and treatment in the processing and treatment units of a wafer which is transferred again.

The wafer W3 which was, for example, being transferred between the developing treatment unit and the post-baking unit when trouble occurred just passes through the adhesion unit, the resist coating unit, the pre-baking unit, the edge exposure processing unit, the exposure processing unit, the post-exposure baking unit, and the developing treatment unit without being subjected to processing and treatment in them, and is then subjected to the post-baking processing in the post-baking unit and returned back into the cassette C as shown in FIG. 8. Besides, the wafer W4 which was in the state before start of the processing in the post-exposure baking unit when trouble occurred just passes through the adhesion unit, the resist coating unit, the pre-baking unit, the edge exposure processing unit, and the exposure processing unit without being subjected to processing and treatment in them, and is then subjected to processing and treatment in the post-exposure baking unit, the developing treatment unit, and the post-baking unit and returned back into the cassette C as shown in FIG. 9.

Figure 10:
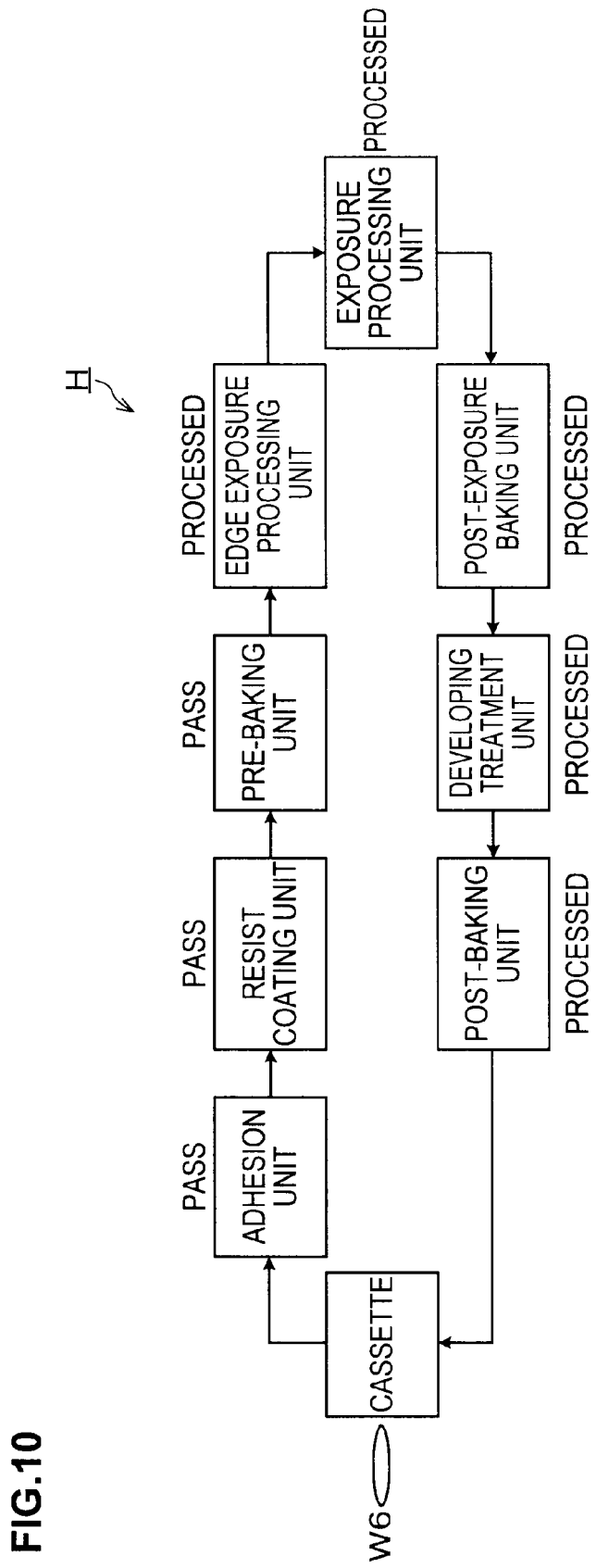
FIG. 10 is an explanatory view showing the presence or absence of processing and treatment in the processing and treatment units of a wafer which is transferred again.

The wafer W6 which was, for example, being transferred between the pre-baking unit and the edge exposure processing unit when trouble occurred just passes through the adhesion unit, the resist coating unit, and the pre-baking unit without being subjected to processing and treatment in them, and is then subjected to processing and treatment in the edge exposure processing unit, the exposure processing unit, the post-exposure baking unit, the developing treatment unit, and the post-baking unit and returned back into the cassette C as shown in FIG. 10. Besides, for example, the wafer W9 to wafer W25 are subjected to processing and treatment in all of the processing and treatment units and then returned back into the cassette C. Thus, each of the wafers W transferred out of the cassette C is subjected to the remaining processing of the processing recipe P which has not been performed due to the occurrence of trouble and then returned back into the original cassette C.

After all of the wafers W1 to W25 are returned back into the cassette C, the processing of that lot ends. Thereafter, normal wafer processing of the next lot in the next cassette is started.

According to the above embodiment, the wafer information I on each of the wafers W which are located in the coating and developing treatment apparatus 1 when trouble occurs is stored. After restart of the coating and developing treatment apparatus 1, all of the wafers W are collected into the cassette C, and the wafers W in that cassette C are transferred using the same transfer recipe H as that before occurrence of trouble. Based on the wafer information I, each of the wafers W is not subjected to processing or treatment in the processing or treatment unit in which the wafer W has already been subjected to the processing or treatment, but is subjected to processing or treatment in a processing or treatment unit in which the wafer W has not been subjected to processing or treatment, thereby performing the remaining processing of the processing recipe P.

In this case, the continuation of the processing of each of the wafers W can be performed using the same transfer recipe H as that before occurrence of trouble, thus eliminating the necessity of creating a new transfer recipe for each of the wafers W at occurrence of trouble and allowing immediate start of the remaining processing for each of the wafers W. Further, the same transfer recipe H for all of the wafers W leads to simple transfer control. Accordingly, the remaining processing for the wafers W which were located in the coating and developing treatment apparatus 1 when trouble occurred can be performed at an early stage and by simple control.

According to the above embodiment, the wafers W for which the processing recipe P had already been completed when trouble occurred are excluded from the wafers W to be transferred out of the cassette C, thereby making it possible to eliminate transfer of the wafers W which do not need processing to reduce the number of wafers W to be transferred, resulting in increased throughput.

It is not certain whether the wafers W which were under processing and treatment in the processing and treatment units when trouble occurred can achieve appropriate processing results even if they are processed again. In the above embodiment, such wafers W are excluded from the wafers W to be transferred, so that only the wafers W which certainly achieve appropriate processing results can be transferred to improve the yield of wafers W. Further, the number of wafers W to be transferred can be reduced to increase the throughput of the wafer processing.

In the above embodiment, the wafer W which was located in the exposure processing unit 4 when trouble occurred may also be excluded from the wafers W to be transferred out of the cassette C. Since the exposure processing unit 4 is a separate apparatus from the coating and developing treatment apparatus 1, the processing state in the exposure processing unit 4 cannot be precisely grasped from the coating and developing treatment apparatus 1 side in some cases. More specifically, it cannot be recognized in some cases whether the wafer W was before start of exposure processing, under exposure processing, or after completion of exposure processing. Accordingly, the wafer W which was located in the exposure processing unit 4 when trouble occurred is excluded from the wafers W to be transferred, thereby ensuring that only the wafers W whose final processing results are expectable can be processed without transferring the wafers whose processing states are not sure. This can stabilize the processing result of the wafer W to improve the yield of the wafers W. Further, the number of wafers W to be transferred can be reduced to increase the throughput of the wafer processing.

The chemicals for use in the photolithography process may need process management (for example, time management). For example, when using a chemically amplified resist, time management from the completion of the exposure to the start of the post-exposure baking is important. In a processing recipe using such a resist as a chemical, when a wafer W was located between the exposure processing unit 4 and the post-exposure baking unit when trouble occurred, an elapsed time from the elimination of the trouble is calculated, and when it exceeds an allowed time, that wafer W may be excluded from the wafers to be transferred. This can stabilize the processing result of the wafer W to improve the yield of the wafers W. Further, the number of wafers W to be transferred can be reduced to increase the throughput of the wafer processing.

Figure 11:
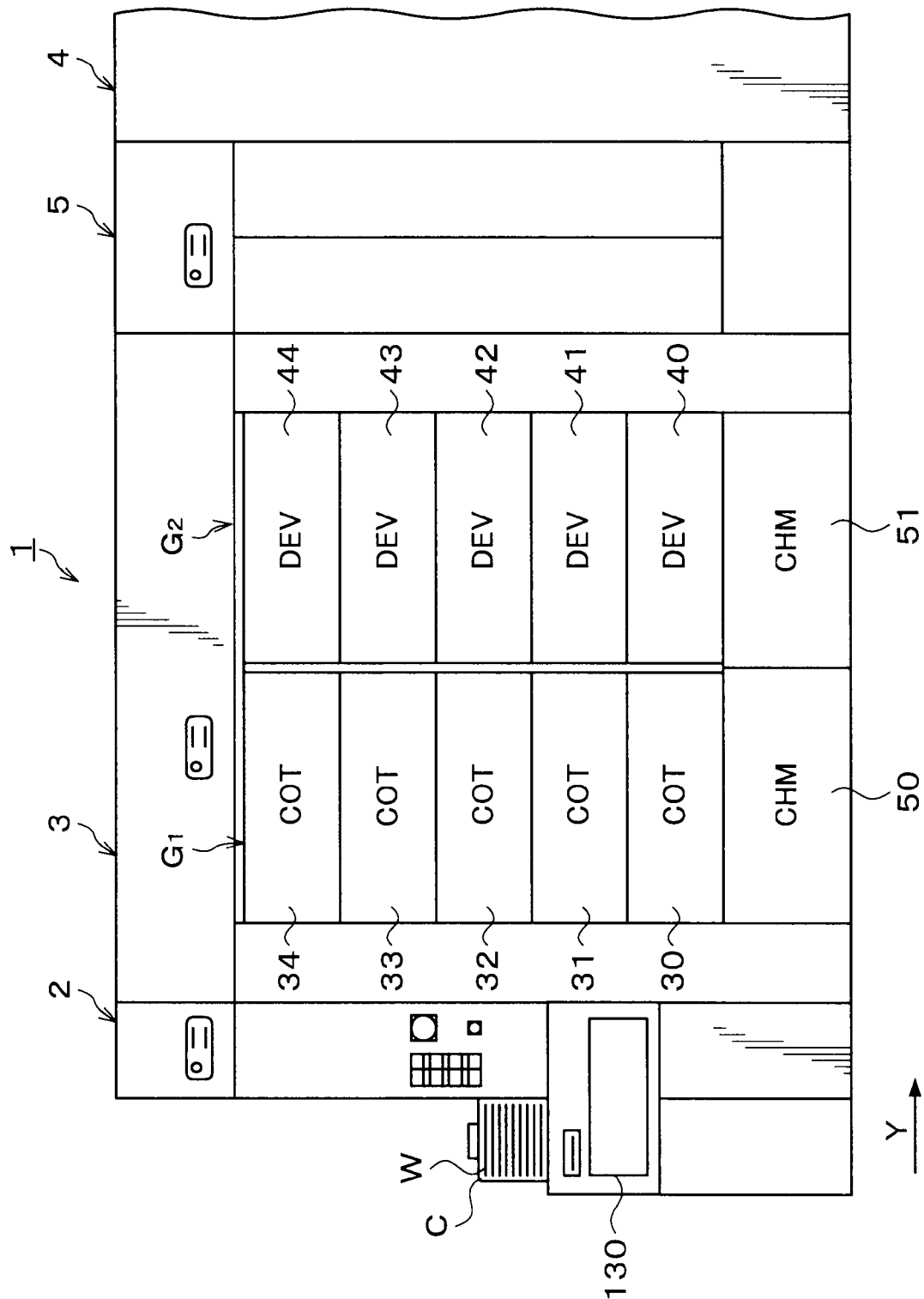
FIG. 11 is a front view of a coating and developing treatment apparatus in which a display unit is provided.

Though setting is made such that the wafers W which were under predetermined conditions when trouble occurred are not transferred again from the cassette C after elimination of the trouble in the above embodiment, setting may be made such that retransfer of the wafers W can be selected. In this case, a display unit 130 displaying the wafer information I may be provided in the coating and developing treatment apparatus 1 as shown in FIG. 11. For the display unit 130, for example, a touch screen is used. As shown in FIG. 12, for example, the position and the processing state (wafer information I) at occurrence of trouble for each of the wafers W are displayed on a display screen 130a of the display unit 130. Further, in the display screen 130a, a transfer selection column, for example, for the wafers W which are set not to be transferred again is provided.

Then, after occurrence of trouble, and after the wafers W are collected into the cassette C, the wafer information I is displayed on the display unit 130. For example, an apparatus user selects the wafers W to be transferred again from among the wafers W which are set not to be transferred again, based on the wafer information I. The selected wafers W are transferred together with the other wafers W which are set to be transferred again. In this case, the wafers W which can achieve appropriate processing results, for example, by the processing by the retransfer can be transferred again by the judgment of the apparatus user, thus reducing, for example, waste of wafers.

Figure 13:
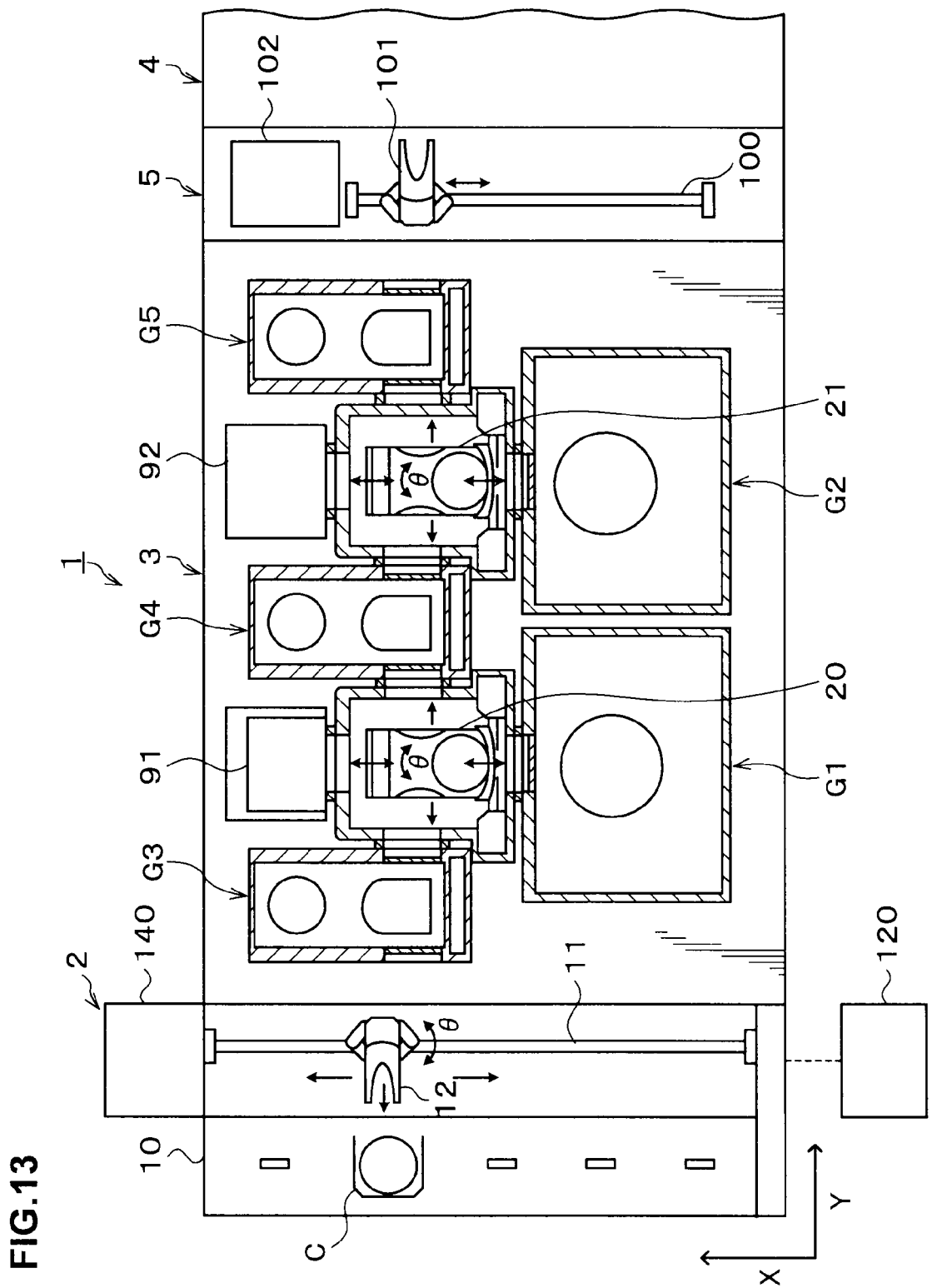
FIG. 13 is a plan view showing the outline of a coating and developing treatment apparatus in which an inspection unit is provided.

In the above example, for example, when the wafer W which was under processing or treatment in the processing or treatment unit when trouble occurred is selected, the wafer may be transferred to each of the processing and treatment units after the wafer W is transferred to an inspection unit and its processing state is inspected. In this case, an inspection unit 140 such as a macro defect unit, a film thickness measuring unit, or a line width measuring unit is provided in the cassette station 2 of the coating and developing treatment apparatus 1 as shown in FIG. 13. Then, when the wafer W which was under processing when trouble occurred is selected and transferred again, the wafer W is first transferred from the cassette C to the inspection unit 140 so that the processing state of the wafer W is inspected. The inspection result is outputted, for example, to the control unit 120.

In the control unit 120, processing conditions for performing the remaining processing of the processing which has been interrupted are calculated, for example, based on the inspection result. For example, processing conditions to achieve a desired processing result by combining the processing before the interruption and the processing after the interruption are calculated. For example, for the wafer W2 which was under post-baking processing when interrupted, the processing conditions of the remaining heating time and the heating temperature in the post-baking unit are calculated. Then, the control unit 120 sets the new processing conditions for the processing unit in which the remaining processing will be performed. The wafer W is processed under the new processing conditions. This ensures that a desired processing result can be finally obtained also for the wafer W which was under processing when trouble occurred.

Figure 14:
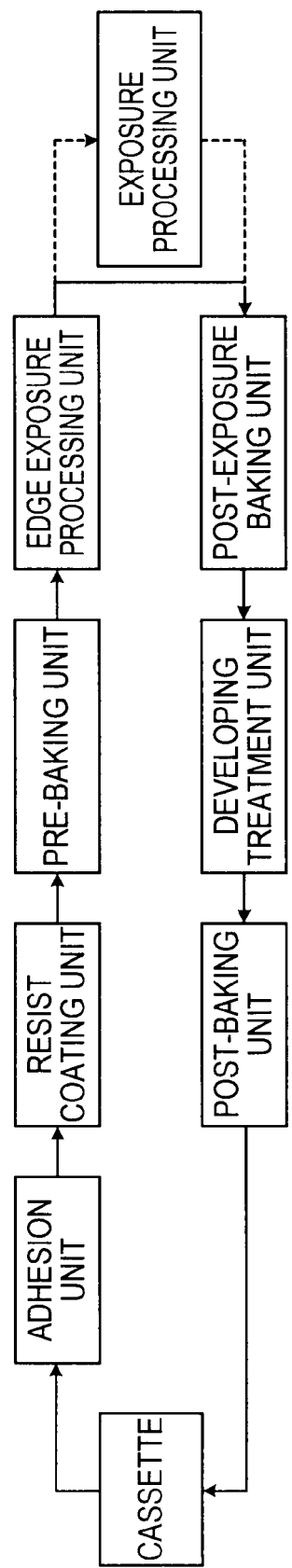
FIG. 14 is an explanatory view showing a transfer route of a wafer when skipping an exposure processing unit.

In the above embodiment, the wafer for which exposure processing had already been completed when trouble occurred may be transferred skipping the exposure processing unit when it is transferred again from the cassette C. In this case, the wafer W is transferred to the post-exposure baking unit subsequent to the edge exposure processing unit as shown in FIG. 14. Since the transfer-into/out of the exposure processing unit takes time, skipping this unit can reduce the total processing time for the wafer W. This can improve the throughput of the wafer processing.

A preferred embodiment of the present invention has been described above with reference to the accompanying drawings, but the present invention is not limited to the embodiment. It should be understood that various changes and modifications are readily apparent to those skilled in the art within the spirit as set forth in claims, and those should also be covered by the technical scope of the present invention. For example, the kinds, the number and the arrangement of the processing and treatment units in the coating and developing treatment apparatus 1 are not limited to those described in this embodiment. Further, the processing recipe P and the transfer recipe H are not limited to those described in this embodiment. The present invention is not limited to the coating and developing treatment apparatus 1, but is also applicable to other substrate treatment apparatuses such as an etching unit, a deposition unit, a cleaning unit and so on. The present invention is also applicable to other substrate processing apparatuses for an FPD (Flat Panel Display), a mask reticle for a photomask, and the like other than the semiconductor wafer.

The present invention is useful in processing again a substrate which was located in a substrate processing apparatus when trouble occurred, at an early stage and by simple control.

What is claimed is:

1. A substrate processing method of performing substrate processing in a predetermined processing recipe in a substrate processing apparatus including a substrate housing unit housing a plurality of substrates and a plurality of processing units performing various kinds of processing on the substrates, by sequentially transferring the plurality of substrates in the substrate housing unit to a predetermined plurality of processing units following a transfer recipe, said method comprising the steps of:

storing, when trouble occurs and an operation of the substrate processing apparatus is stopped, substrate information containing positions and processing states of the substrates located in the substrate processing apparatus at that time;

collecting, when a power supply of the substrate processing apparatus is then turned off and thereafter the substrate processing apparatus is restarted, the substrates located in the substrate processing apparatus into the substrate housing unit; and thereafter sequentially transferring each of the substrates in the substrate housing unit to the predetermined plurality of processing units following a same transfer recipe as that before occurrence of trouble, and not performing processing on the substrate in a processing unit in which processing for the substrate has already been completed but performing processing on the substrate in a processing unit in which processing for the substrate has not been performed yet based on the substrate information to thereby perform remaining substrate processing of the predetermined processing recipe.

2. The substrate processing method as set forth in claim 1, wherein a substrate for which the processing in the predetermined processing recipe had already been completed and a substrate which was under processing in a processing unit when trouble occurred are not transferred from the substrate housing unit after the substrate collection to the predetermined plurality of processing units based on the substrate information.

3. The substrate processing method as set forth in claim 2, wherein the substrate processing apparatus is an apparatus performing photolithography processing on the substrates, the apparatus including at least a resist coating treatment unit applying a resist solution onto the substrates before exposure processing and a developing treatment unit performing developing treatment on the substrates after exposure processing, and capable of passing the substrates to/from an exposure processing unit adjacent to the substrate processing apparatus, and wherein a substrate which was located in the exposure processing unit when trouble occurred is not transferred from the substrate housing unit after the substrate collection to the predetermined plurality of processing units.

4. The substrate processing method as set forth in claim 1, wherein when a substrate which was under processing in a processing unit when trouble occurred is transferred to a predetermined plurality of processing units based on the substrate information, the substrate is transferred to an inspection unit and a processing state of the substrate is inspected, and the substrate is then sequentially transferred to the predetermined plurality of processing units.

5. The substrate processing method as set forth in claim 4, wherein a processing condition in a processing unit at a transfer destination is changed based on an inspected result.

6. The substrate processing method as set forth in claim 4, wherein the substrate information is displayed on a display unit of the substrate processing apparatus.

7. The substrate processing method as set forth in claim 1, wherein the substrate processing apparatus is an apparatus performing photolithography processing on the substrates, the apparatus including at least a resist coating treatment unit applying a resist solution onto the substrates before exposure processing and a developing treatment unit performing developing treatment on the substrates after exposure processing, and capable of passing the substrates to/from an exposure processing unit adjacent to the substrate processing apparatus, and wherein a substrate for which exposure processing had already been completed when trouble occurred is transferred skipping the exposure processing unit when the substrate is transferred from the substrate housing unit after the substrate collection to the predetermined plurality of processing units.

8. A substrate processing apparatus including a substrate housing unit housing a plurality of substrates and a plurality of processing units performing various kinds of processing on the substrates, for performing substrate processing in a predetermined processing recipe by sequentially transferring the plurality of substrates in the substrate housing unit to a predetermined plurality of processing units following a transfer recipe, said apparatus comprising:

a control unit conducting control to store, when trouble occurs and an operation of said substrate processing apparatus is stopped, substrate information containing positions and processing states of the substrates located in said substrate processing apparatus at that time; collect, when said substrate processing apparatus is restarted, the substrates located in said substrate processing apparatus into said substrate housing unit; and sequentially transfer each of the substrates in said substrate housing unit to said predetermined plurality of processing units following a same transfer recipe as that before occurrence of trouble, and not perform processing on the substrate in a processing unit in which processing for the substrate has already been completed but perform processing on the substrate in a processing unit in which processing for the substrate has not been performed yet based on the substrate information to thereby perform remaining substrate processing of the predetermined processing recipe.

9. The substrate processing apparatus as set forth in claim 8,
wherein setting is made in said control unit such that a substrate for which the processing in the predetermined processing recipe had already been completed and a substrate which was under processing in a processing unit when trouble occurred are not transferred from said substrate housing unit after the substrate collection to said predetermined plurality of processing units based on the substrate information.

10. The substrate processing apparatus as set forth in claim 9,
wherein said substrate processing apparatus is an apparatus performing photolithography processing on the substrates, said apparatus including at least a resist coating treatment unit applying a resist solution onto the substrates before exposure processing and a developing treatment unit performing developing treatment on the substrates after exposure processing, and capable of passing the substrates to/from an exposure processing unit adjacent to said substrate processing apparatus, and
wherein setting is made in said control unit such that a substrate which was located in said exposure processing unit when trouble occurred is not transferred from said substrate housing unit after the substrate collection to said predetermined plurality of processing units.

11. The substrate processing apparatus as set forth in claim 9,
wherein from among the substrates for which setting is made not to be transferred from said substrate housing unit to said predetermined plurality of processing units, a substrate that is transferred to said predetermined plurality of processing units despite said setting is able to be selected, and
wherein when the selected substrate is a substrate which was under processing in a processing unit when trouble occurred, and when the substrate is transferred, the substrate is transferred to an inspection unit by said control unit and a processing state of the substrate is inspected, and the substrate is then sequentially transferred to said predetermined plurality of processing units.

12. The substrate processing apparatus as set forth in claim 11,
wherein a processing condition in a processing unit when the transfer is performed is changed by said control unit based on an inspection result.

13. The substrate processing apparatus as set forth in claim 11, further comprising:
a display unit displaying the substrate information.

14. The substrate processing apparatus as set forth in claim 8,
wherein said substrate processing apparatus is an apparatus performing photolithography processing on the substrates, said apparatus including at least a resist coating treatment unit applying a resist solution onto the substrates before exposure processing and a developing treatment unit performing developing treatment on the substrates after exposure processing, and capable of passing the substrates to/from an exposure processing unit adjacent to the substrate processing apparatus, and
wherein a substrate for which exposure processing had already been completed when trouble occurred is transferred skipping said exposure processing unit when the substrate is transferred from said substrate housing unit after the substrate collection to said predetermined plurality of processing units by said control unit.

15. A computer-readable storage medium storing a program running on a computer of a control unit controlling a substrate processing apparatus to cause said substrate processing apparatus to execute a substrate processing method, said substrate processing apparatus including a substrate housing unit housing a plurality of substrates and a plurality of processing units performing various kinds of processing on the substrates,
wherein said substrate processing method is a substrate processing method of performing substrate processing in a predetermined processing recipe by sequentially transferring the plurality of substrates in the substrate housing unit to a predetermined plurality of processing units following a transfer recipe,
said substrate processing method further comprising the steps of:
storing, when trouble occurs and an operation of the substrate processing apparatus is stopped, substrate information containing positions and processing states of the substrates located in the substrate processing apparatus at that time;
collecting, when a power supply of the substrate processing apparatus is then turned off and thereafter the substrate processing apparatus is restarted, the substrates located in the substrate processing apparatus into the substrate housing unit; and
thereafter sequentially transferring each of the substrates in the substrate housing unit to the predetermined plurality of processing units following a same transfer recipe as that before occurrence of trouble, and not performing processing on the substrate in a processing unit in which processing for the substrate has already been completed but performing processing on the substrate in a processing unit in which processing for the substrate has not been performed yet based on the substrate information to thereby perform remaining substrate processing of the predetermined processing recipe.

* * * * *